United States Patent
Kartal et al.

(10) Patent No.: US 7,705,369 B2
(45) Date of Patent: Apr. 27, 2010

(54) HIGH-VOLTAGE DIODE WITH OPTIMIZED TURN-OFF METHOD AND CORRESPONDING OPTIMIZATION METHOD

(75) Inventors: Veli Kartal, München (DE); Hans-Joachim Schulze, Ottobrunn (DE); Anton Mauder, Kolbermoor (DE); Elmar Falck, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/999,111

(22) PCT Filed: Mar. 27, 2003

(86) PCT No.: PCT/DE03/01725

§ 371 (c)(1),
(2), (4) Date: Jun. 29, 2005

(87) PCT Pub. No.: WO03/103059

PCT Pub. Date: Dec. 11, 2003

(65) Prior Publication Data
US 2005/0230702 A1    Oct. 20, 2005

(51) Int. Cl.
*H01L 29/861* (2006.01)

(52) U.S. Cl. ............... 257/156; 257/E29.327; 257/502; 257/617

(58) Field of Classification Search .......... 257/656, 257/109, 161, 502, 112, 603, 612, 156, 617, 257/605, E29.327, E29.335–E29.337, E29.107, 257/604

See application file for complete search history.

(56) References Cited

U.S. PATENT DOCUMENTS

| | | | |
|---|---|---|---|
| 4,752,818 A | * | 6/1988 | Kushida et al. ............. 257/136 |
| 5,747,872 A | | 5/1998 | Lutz et al. |
| 5,883,403 A | * | 3/1999 | Ishikawa et al. ............ 257/156 |
| 2003/0122151 A1 | | 7/2003 | Mauder et al. |
| 2003/0197247 A1 | | 10/2003 | Mauder et al. |

FOREIGN PATENT DOCUMENTS

| | | |
|---|---|---|
| DE | 44 21 529 A1 | 12/1995 |
| DE | 100 31 461 A1 | 1/2002 |

OTHER PUBLICATIONS

Humbel et al., "4.5kV-Fast-Diodes with Expanded SOA Using a Multi-Energy Proton Lifetime Control Technique", IEEE 11$^{th}$ Annual Symposium on Power Semiconductor Devices and ICs, New York, May 26, 1999, pp. 121-124, (4 pages).
Tadano et al., "High-Performance Si-Thyristor and Its Application to PWM Inverter", PESC '88 Record, 19$^{th}$ Annual IEEE Power Electronics Specialists Conference, Apr. 1988, pp. 1303-1310, (8 pages).
Nishiwaki et al., "A Fast & Soft Recovery Diode with Ultra Small Qrr (USQ-Diode) Using Local Lifetime Control by He Ion Irradiation", 2001 International Symposium on Power Semiconductor Devices and ICs, 2001, pp. 235-238, (4 pages).

* cited by examiner

*Primary Examiner*—Matthew C. Landau
(74) *Attorney, Agent, or Firm*—Maginot, Moore & Beck

(57) ABSTRACT

The invention relates to a high-voltage diode having a specifically optimized switch-off behavior. A soft recovery behavior of the component can be obtained without increasing the forward losses by adjusting in a specific manner the service life of the charge carriers by irradiating only the n$^+$-conducting cathode emitter (6) side or both sides, i.e. the n$^+$-conducting cathode emitter (6) side and the p$^+$-conducting anode emitter (4) side.

3 Claims, 3 Drawing Sheets

Stand der Technik

HIGH-VOLTAGE DIODE WITH OPTIMIZED TURN-OFF METHOD AND CORRESPONDING OPTIMIZATION METHOD

CROSS-REFERENCE TO RELATED APPLICATIONS

This application is a national stage entry of PCT application no. PCT/DE03/01725, filed May 27, 2003.

FIELD OF THE INVENTION

The present invention relates to a high-voltage diode and more particularly to a high-voltage diode with improved turn-off behavior and a method of improving the turn-off behavior of a high-voltage diode.

BACKGROUND

German patent application no. DE 100 31 461.9 A1 discloses a high-voltage diode. In the case of such high-voltage diodes, often used as free-wheeling diodes, a soft turn-off behavior is desired in order to avoid the so-called "chopping" of the component during the turn-off process, since this effect can entail destruction of the power semiconductor. Component chopping has been avoided hitherto either by choosing a sufficiently large thickness for the component and/or by means of an anodal local lifetime setting.

The accompanying FIG. 1 schematically shows the structure of the known high-voltage diode in the form of a central cross section. Such a high-voltage diode comprises a silicon body. Instead of silicon, it is also possible to choose another suitable semiconductor material, such as e.g. SiC, etc. The silicon body has an $n^-$-conducting drift zone 1, a p-conducting zone 2, which forms a pn junction 3 with the n-conducting drift zone, a $p^+$-conducting anode emitter 4, an n-conducting zone 5 and an $n^+$-conducting cathode emitter 6 formed therein. On the front side V, the anode emitter 4 is provided with an anode metallization 7. On the rear side R of the component, the cathode emitter 6 is provided with a cathode metallization 8. Known contact materials such as e.g. aluminum, AlSi, etc. may be chosen for said metallization. It should be mentioned that the dimensions of the known high-voltage diode shown in FIG. 1 serve merely for elucidation purposes and do not represent the actual relationships.

In the case of the high-voltage diode disclosed in this document, the setting of the charge carrier lifetime takes place by means of crystal damage near the surface in the anode emitter or in the cathode emitter.

For optimizing the turn-off behavior of a high-voltage diode, the procedure heretofore has been such that the charge carrier lifetime has been reduced exclusively in the $p^+$-conducting anode emitter. FIG. 2 illustrates a simulation of the resulting relationships of the doping concentration (curve A) and the defect concentration (curve B) of a high-voltage diode influenced in this way, to be precise relative to the depth y from the front side V here, y starting with the top side of the $p^+$-type anode emitter. FIG. 2 shows that a large local increase in the defect concentration (curve B) occurs in the $p^+$-type anode emitter approximately at a depth y of between 15 and 18 μm from the top side thereof, which locally reduces the charge carrier lifetime (τ) there.

In the case of such high-voltage diodes, it is always necessary to find a compromise between the "soft recovery behavior" of the component, the switching losses and the forward voltage drop or the on-state losses. This requirement is not taken into account by the known method for optimizing the turn-off-method as explained with reference to FIG. 2 since, although it obtains a soft turn-off behavior, this is at the expense of a higher forward voltage drop or an increased on-state power loss.

Humble O. et al.: "4.5 Kilovolt-Fast Diodes with Expanded SOA Using a Multi-Energy Proton Life Time Control Technique", 11th International Symposium on Power Semiconductor Devices and ICs, ISPSD 99. Proceedings, Toronto, May 26-28, 1999, International Symposium on Power Semiconductor Devices and ICs, New York, N.Y.: IEEE, US, May 26, 1999, May 26, 1999 pages 121-124, XP000903559 ISBN: 0-78-03-5291-2, describes a power diode with setting of the emitter efficiency and charge carrier lifetime both in the cathode region of the diode and in the n-type base region, to be precise by irradiation with proton beams or α-particles. FIG. 3 in the right-hand column of page 121 of this document shows that although the first proton peak lies in the cathode region of the diode, the second proton peak lies near the center of the n-type base.

SUMMARY

It is an object of this invention to optimize a high-voltage diode of the generic type such that, on the one hand, it has a minimum component thickness in order to minimize the power losses that occur during operation, and that, on the other hand, it has a "soft recovery" behavior during turn-off, thereby avoiding component chopping and the risk of its destruction.

In accordance with a first aspect, this object is achieved by means of a high-voltage diode having an anodal p-conducting zone, a cathodal $n^-$-conducting drift zone, which forms a pn junction with the p-conducting zone, a $p^+$-conducting anode emitter provided in the p-conducting zone, and an $n^+$-conducting cathode emitter adjoining an n-conducting zone subsequent to the pn junction, wherein only from the cathode emitter or from the cathode emitter and from the anode emitter, by means of irradiation with light ions, in particular α-particles, the charge carrier lifetime τ is reduced to a value dependent on the doping concentration of the anode emitter at a distance from the respective emitter surface, said distance being determined by the range and/or dose of the irradiation, beyond the respective emitter in a limited depth range, the charge carrier lifetime τ being reduced to a great extent in the case of a heavily doped anode emitter and the charge carrier lifetime τ being reduced weakly or not at all in the case of a weakly doped anode emitter.

In accordance with a second aspect of the invention, the above object is achieved by means of a method for optimizing the turn-off behavior of a high-voltage diode having an anodal p-conducting zone, a cathodal $n^-$-conducting drift zone, which forms a pn junction with the p-conducting zone, a $p^+$-conducting anode emitter provided in the p-conducting zone, and an $n^+$-conducting cathode emitter adjoining an n-conducting zone subsequent to the pn junction, featuring the following steps: irradiation with light ions, in particular α-particles, either only of the cathode emitter from the top side thereof with a specific dose and with a specific range, or of the cathode emitter and of the anode emitter in each case from the top sides thereof with in each case a specific dose and with in each case a specific range, the irradiation reducing the charge carrier lifetime τ to a value dependent on the doping concentration of the anode emitter either only from the side of the cathode emitter or from the side of the cathode emitter and the side of the anode emitter at a distance from the respective emitter surface, said distance being determined by the respective dose and/or range of the irradiation, in a limited depth range beyond the respective emitter, the charge carrier lifetime τ being reduced to a great extent in the case of a heavily doped anode emitter and the charge carrier lifetime τ being reduced weakly or not at all in the case of a weakly doped anode emitter.

This enables a soft recovery behavior of the high-voltage diode without increasing the on-state losses in an undesirable manner.

BRIEF DESCRIPTION OF THE DRAWINGS

The description below describes, referring to the drawing, two alternative embodiments of the high-voltage diode according to the invention and of the method used for optimizing its turn-off behavior. In the figures of the drawing, specifically.

DETAILED DESCRIPTION

Figure 1:
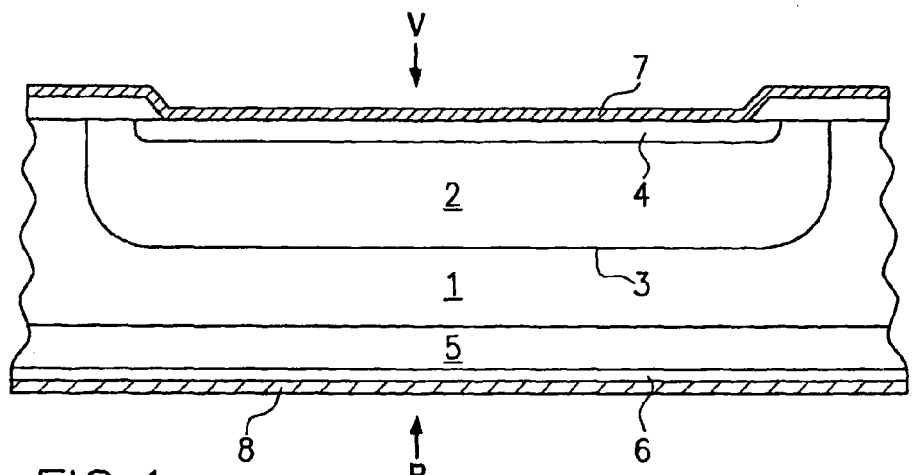
FIG. 1 shows a cross section through the structure of a known high-voltage diode already discussed.

The description below is based by way of example on the structure of a high-voltage diode that is shown in FIG. 1 and has already been discussed. The dimensions shown in FIG. 1, in particular the thicknesses of the respective zones and regions, are not to scale and serve only for elucidation.

Figure 3:
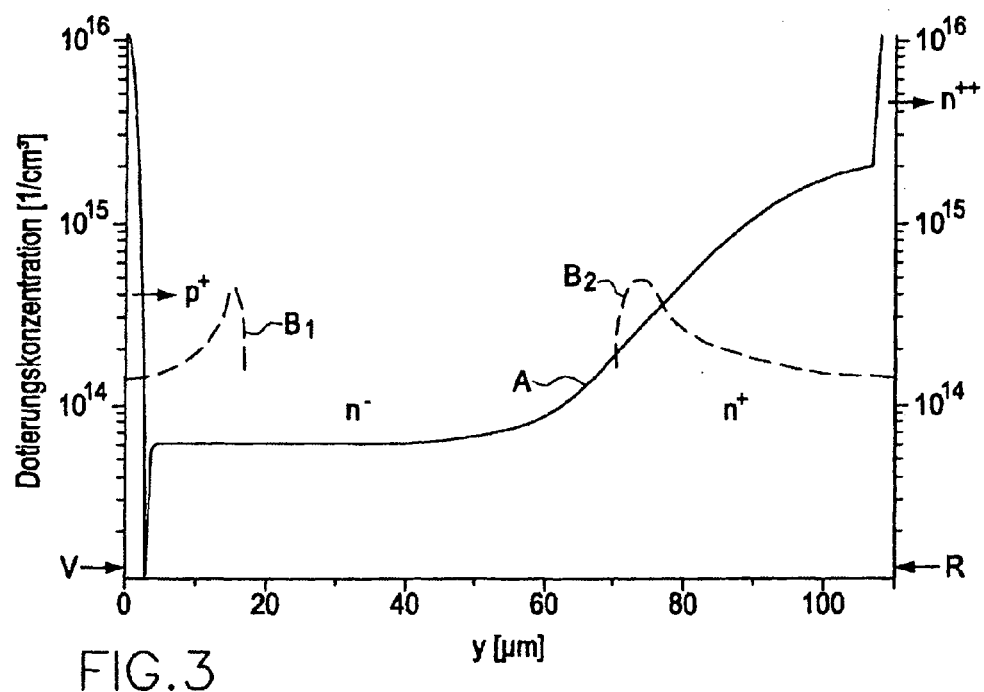
FIG. 3 graphically shows simulation curves of the results of a first exemplary embodiment of a high-voltage diode according to the invention if the charge carrier lifetime τ is reduced from both sides of the high-voltage diode.

FIG. 3 graphically shows simulation results of the doping concentration profile by means of the solid curve A and of the defect concentration profile of a high-voltage diode according to the invention by means of the curves B1 and B2 depicted in dashed fashion. It is clear that in the case of this reduction of the charge carrier lifetime τ from both sides, i.e. from the front side V, that is to say that from the top side of the $p^+$-type anode emitter 4 and from the rear side R, that is to say from the top side of the $n^+$-type cathode emitter 6, in each case at a depth of between approximately 15 and 18 μm from the front side V and between approximately 70 and 80 μm from the front side V, a large increase in the defect concentration is obtained locally.

The magnitude of the reverse current peak (cf. FIG. 5) is set by means of the local and targeted reduction of the charge carrier lifetime τ from the $p^+$-type anode emitter side (curve B1). The reduction of the charge carrier lifetime from the $n^+$-type cathode emitter side is used to control the decrease in the charge carriers during depletion of the drift zone 1.

Figure 5:
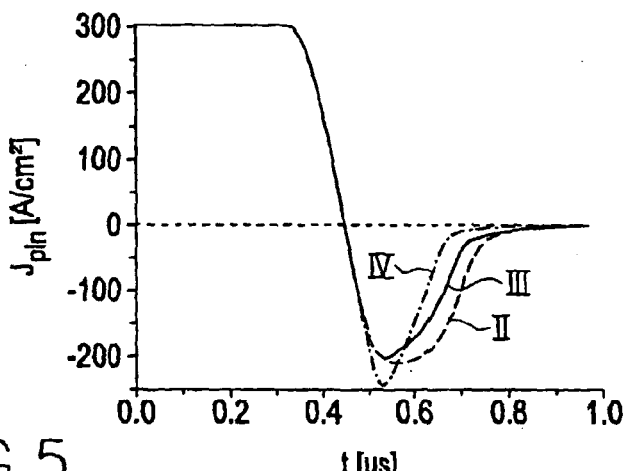
FIG. 5 graphically shows current profiles, i.e. the current density during the turn-off of a high-voltage diode, the charge carrier lifetime of which has in each case been reduced by a method in accordance with FIGS. 2, 3 and 4.

The combination of both measures for reducing the charge carrier lifetime τ as illustrated in FIG. 3 makes it possible on the one hand to achieve a small reverse current peak and on the other hand to ensure a soft turn-off of the component (cf. FIG. 5, curve III). This brings about a lower induced voltage that arises on account of the parasitic inductance (cf. FIG. 6, curve III).

Figure 4:
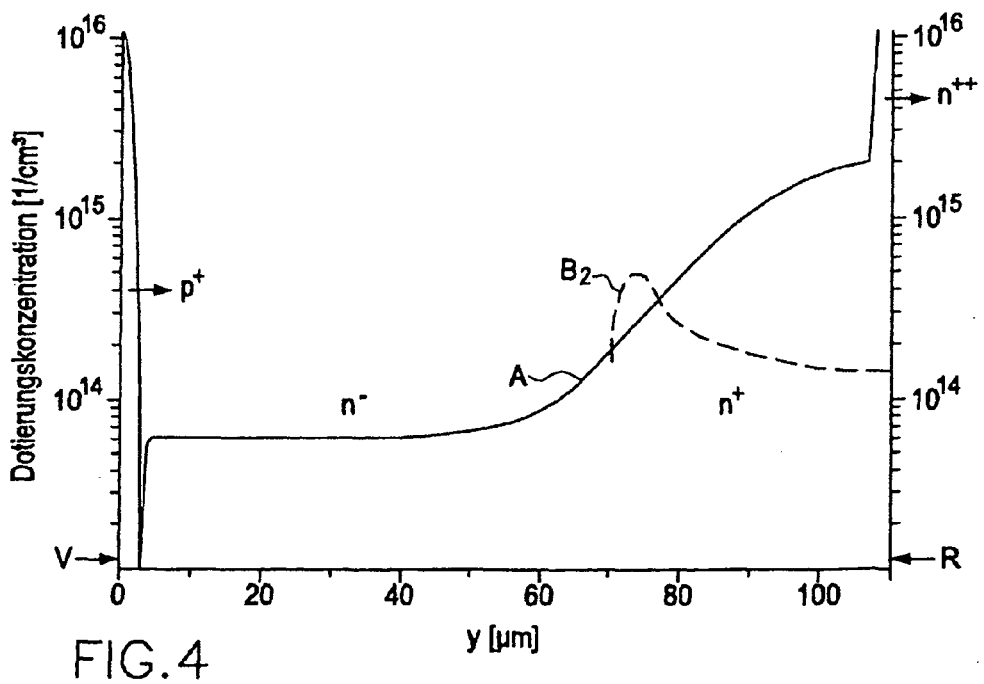
FIG. 4 shows a simulation of the doping and defect concentration profile in the case of a second exemplary embodiment of the invention, in which the charge carrier lifetime is reduced exclusively from the rear-side cathode emitter.

FIG. 4 illustrates, on the basis of simulation results, the doping and defect concentration profiles (curves A and B2) in the case of irradiation exclusively on the $n^+$-type cathode emitter side and thus the second measure proposed according to the invention in order to enable the soft recovery behavior of the component without in this case increasing the on-state and switching losses. This proposed method consists in locally implementing the lifetime of the charge carriers only from the $n^+$-type cathode emitter side instead of from the $p^+$-type anode emitter side (cf. FIG. 2). The desired soft recovery behavior of the high-voltage diode can be established through the range of the irradiation and/or the choice of dose.

Figure 2:
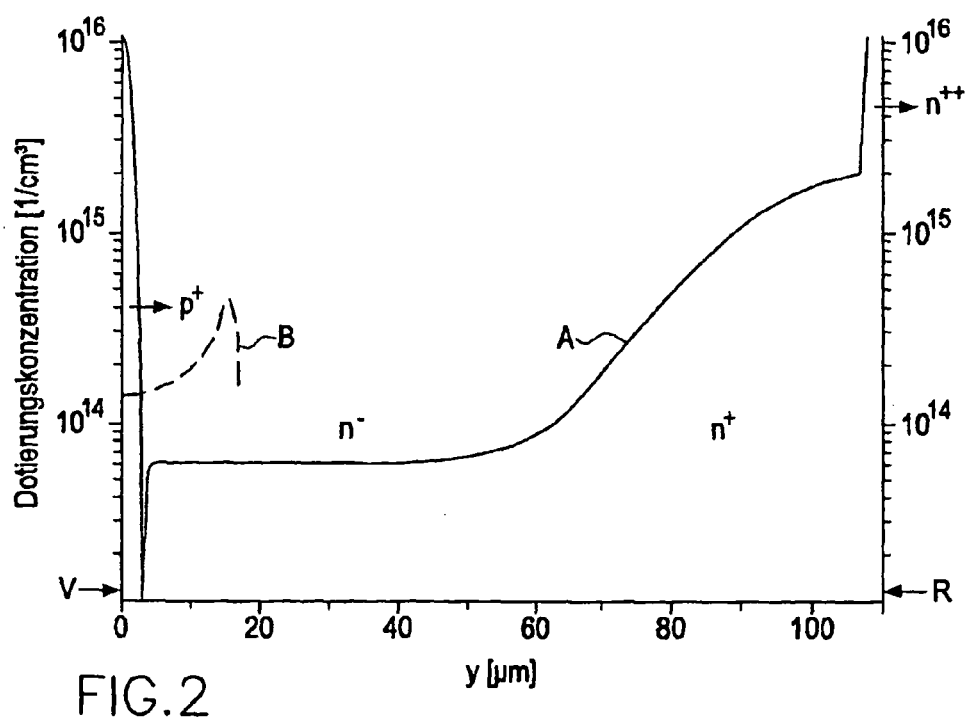
FIG. 2 graphically shows simulation curves for elucidating the already discussed procedure for locally reducing the charge carrier lifetime τ exclusively from the side of the $p^+$-type anode emitter.

FIG. 5 graphically shows a simulation of the profiles of the current density $J_{pin}$ against time t during the turn-off of the high-voltage diode by means of the various irradiation techniques described previously; to be precise curve II shows the known method already explained with reference to FIG. 2 in the case of which the charge carrier lifetime is reduced only from the side of the $p^+$-type anode emitter 4, curve III shows the first alternative of the method according to the invention which was explained with reference to FIG. 3, in the case of which the charge carrier lifetime is reduced from both sides, i.e. on the part of the $p^+$-type anode emitter and on the part of the $n^+$-type cathode emitter, and curve IV finally shows the second alternative described with reference to FIG. 4, in the case of which the charge carrier lifetime τ is reduced only from the $n^+$-type cathode emitter side.

Figure 6:
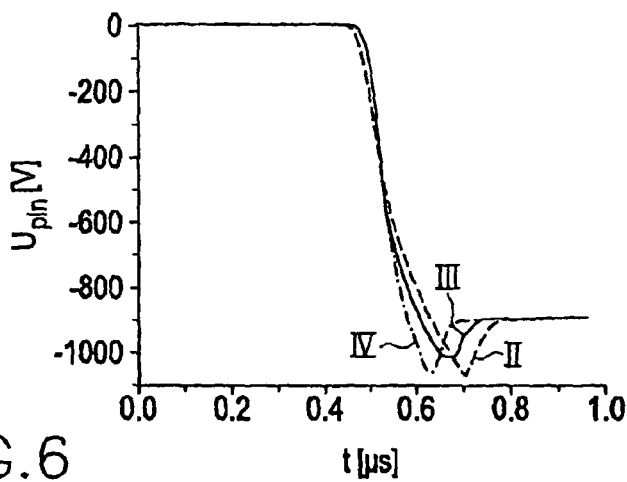
FIG. 6 graphically shows voltage profiles during the turn-off of a high-voltage diode, the charge carrier lifetime of which has in each case been reduced by a method in accordance with FIGS. 2, 3 and 4, and FIG. 7 graphically shows the turn-off work loss of a high-voltage diode in which the charge carrier lifetime has been reduced by the methods shown previously in FIGS. 2 to 4.

Curves II, III and IV in FIG. 6 reproduce simulation results of the voltage profiles during the turn-off of the high-voltage diode by means of the two irradiation techniques according to the invention (curves III and IV) in comparison with the known irradiation for reducing the charge carrier lifetime τ only from the side of the $p^+$-type anode emitter (curve II).

Figure 7:
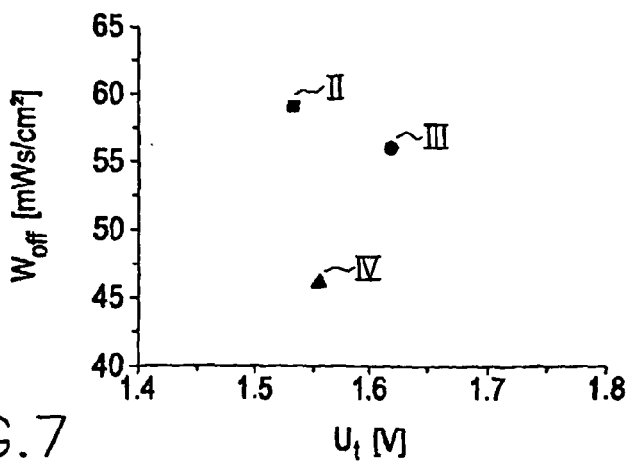

FIG. 7 finally shows a comparison of the three procedures, i.e. of the two procedures proposed according to the invention and the procedure that is customary in the prior art, on the basis of the turn-off work loss $W_{off}$ of the high-voltage diode. The square point designated by II indicates the turn-off work loss of a high-voltage diode treated in accordance with the prior art. The points designated by III and IV indicate the turn-off work loss $W_{off}$ of a high-voltage diode treated by means of the two alternative procedures according to the invention with regard to the charge carrier lifetime. The comparison of the known procedure and the two procedures according to the invention that is illustrated in FIGS. 5 to 7 shows that the best result between the soft recovery behavior, the forward voltage drop and the turn-off work loss is to be obtained by rear-side irradiation (FIG. 4 and FIGS. 5 to 7, curves IV). The smallest reverse current and voltage peak can be obtained by means of the two-sided setting of the charge carrier lifetime τ (FIG. 3 and FIGS. 5-7, curves III).

The intensity of the local lifetime reduction that is to be aimed for on the $p^+$-type anode emitter side results from the doping profile of said $p^+$-type anode emitter; in other words, a relatively intense local reduction of the charge carrier lifetime is desirable in the case of a strong, highly doped anode emitter. In the case of a weakly doped $p^+$-type anode emitter, in the extreme case, no local reduction of the charge carrier lifetime τ is necessary at all on the side of the p⁺-type anode emitter since only relatively few free charge carriers are injected from said emitter.

What is crucial for the reduction of the charge carrier life-time on the side of the n-type cathode emitter is that it is effected in the field stop and at a significant certain distance from the n⁺-type cathode emitter. The silicon bulk between the position of the reduction of the charge carrier lifetime τ and the n⁺-type cathode emitter stores the flooding charge that leads to the soft recovery behavior of the high-voltage diode. This accounts for the difference from PT/IGBT structures, for example, where the reduction of the charge carrier lifetime τ is intended to be situated as far as possible just in front of the rear side emitter in order to obtain a minimum storage and flooding charge.

Generally, a so-called Kleinmann diode, that is a diode with a horizontal constant charge carrier profile in the on-state case, yields the most favorable trade-off between on-state behavior and the total diode-induced switching losses. However, the Kleinmann diode structure has a very rough switching behavior. Current chopping, as mentioned, is undesirable in many applications because the high overvoltage at leakage inductances due to the high di/dt can lead to the destruction of the components or at least to an unfavorable EMC behavior.

The invention makes it possible to increase the switching losses in a targeted manner in favor of a softer switching behavior. The most moderate increase in the switching losses is achieved by introducing a local reduction of the charge carrier lifetime τ in the field stop zone approximately at or just in front of the location reached by the electric field at maximum intermediate circuit voltage. The rear side emitter, i.e. the n⁺-type cathode emitter, is deliberately made stronger than in the case of a Kleinmann diode. The doping of the field stop zone itself is made comparatively low and is significantly less than $10^{16}/cm^3$. The total field stop dose approximately has the value of the breakdown charge or somewhat more than that. Consequently, the electric field reaches far into the field stop zone, and the establishment of the space charge zone and thus the voltage rise at the chip is braked by means of the depletion of the flooding charge. It is possible for the field stop to be made lightly doped here because, unlike in other cases, it does not have to function as an "emitter brake". The n⁺-type cathode emitter is set in a targeted manner by means of other techniques, such as, for example, the choice of implantation dose.

For the reduction of the charge carrier lifetime τ only from the front side, i.e. from the side of the p⁺-type anode emitter 4, described with reference to FIG. 2, the most favorable switching properties of the high-voltage diodes are achieved in direct proximity to the pn junction at the anode.

If the efficiency of the p⁺-type anode emitter 4 is then reduced, whether by low implantation doses or by local reduction of the charge carrier lifetime τ, a soft turn-off is achieved with a reduced overall thickness of the n-doped base and with the procedures proposed above according to the invention. A further possibility is the combination of the reduction of the charge carrier lifetime τ with the field stop diffusion, i.e. a reduction of the charge carrier lifetime τ which has a spatially greater extent and is more moderate in return.

The procedures according to the invention for reducing the charge carrier lifetime τ (on both sides or exclusively on the n⁺-type cathode emitter side) afford the possibility of adapting diodes to different customer wishes (soft or hard turn-off, reverse current peak, switching losses) without intervening in the production technology in this case. This enables a high degree of flexibility in the realization of high-voltage diodes.

The invention claimed is:

1. A high-voltage diode having a front and a rear side and comprising:
   a p⁺-conducting anode emitter including an upper side adjacent an anode metallization provided at the front side of the high-voltage diode;
   an anodal p-conducting zone provided beneath and adjacent the p⁺-conducting anode emitter;
   a n⁻-conducting drift zone provided beneath and adjacent the anodal p-conducting zone so as to form a p-n junction;
   an n-conducting zone provided beneath and adjacent the n⁻-conducting drift zone;
   an n⁺-conducting cathode emitter provided beneath and adjacent the n-conducting zone; and having a lower side adjacent a cathode metallization provided at the rear side of the high-voltage diode; and
   a first plurality of defects provided within the high-voltage diode and operable to reduce the charge carrier lifetime at the cathode side of the high-voltage diode, the first plurality of defects characterized by a defect concentration increasing from a predetermined concentration level at the n⁺-conducting cathode emitter to a local concentration peak level lying within a field stop region at a certain distance from the n⁺-conducting cathode emitter, the certain distance being a function of a range and/or dose of α-particles provided into the lower side of the n⁺-conducting cathode emitter.

2. The high-voltage diode of claim 1, further comprising:
   a second plurality of defects provided within the high-voltage diode and operable to reduce the charge carrier lifetime at the anode side of the high-voltage diode, the second plurality of defects characterized by a defect concentration increasing from a predetermined concentration level at the p⁺-conducting anode emitter to a local concentration peak level lying within the anodal p-conducting zone at a certain distance from p⁺-conducting anode emitter, the certain distance being a function of a range and/or dose of α-particles into the upper side of the p⁺-conducting anode emitter.

3. The high voltage diode of claim 2, wherein the distance of the local concentration peak from the upper side of the p⁺-conducting anode emitter is approximately between 15 μm and 18 μm.

* * * * *

UNITED STATES PATENT AND TRADEMARK OFFICE
CERTIFICATE OF CORRECTION

| | | |
|---|---|---|
| PATENT NO. | : 7,705,369 B2 | Page 1 of 1 |
| APPLICATION NO. | : 10/999111 | |
| DATED | : April 27, 2010 | |
| INVENTOR(S) | : Kartal et al. | |

It is certified that error appears in the above-identified patent and that said Letters Patent is hereby corrected as shown below:

In the title page:

(22) PCT Filed: replace "Mar. 27, 2003" with --May 27, 2003--

(30) Foreign Application Priority Data: insert --May 29, 2002 (DE).................10223951.7--

Signed and Sealed this

Eighteenth Day of January, 2011

David J. Kappos
*Director of the United States Patent and Trademark Office*